United States Patent
No et al.

(10) Patent No.: US 9,444,076 B2
(45) Date of Patent: Sep. 13, 2016

(54) DISPLAY DEVICE COMPRISING POLARIZING LAYER

(71) Applicant: Samsung Display Co., Ltd., Yongin (KR)

(72) Inventors: Donghun No, Cheongju-si (KR); Jonghwan Kim, Busan (KR); Tetsuji Kamine, Asan-si (KR); Hyeondeuk Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/725,856

(22) Filed: May 29, 2015

(65) Prior Publication Data

US 2016/0093833 A1    Mar. 31, 2016

(30) Foreign Application Priority Data

Sep. 29, 2014   (KR) ........................ 10-2014-0130115

(51) Int. Cl.
*H01L 51/52*   (2006.01)
*H01L 51/56*   (2006.01)

(52) U.S. Cl.
CPC ....... *H01L 51/5293* (2013.01); *H01L 51/5246* (2013.01); *H01L 51/5284* (2013.01); *H01L 51/56* (2013.01)

(58) Field of Classification Search
CPC ............... H01L 51/5293; H01L 51/56; H01L 51/5246; G02F 1/00
See application file for complete search history.

(56) References Cited

U.S. PATENT DOCUMENTS

| | | | |
|---|---|---|---|
| 7,872,414 B2 * | 1/2011 | Sugita | B82Y 20/00 313/506 |
| 7,902,567 B2 | 3/2011 | Oh et al. | |

FOREIGN PATENT DOCUMENTS

| | | |
|---|---|---|
| KR | 10-0682963 | 2/2007 |
| KR | 10-2009-0037079 | 4/2009 |
| KR | 10-2012-0109100 | 10/2012 |
| KR | 10-2013-0135671 | 12/2013 |

* cited by examiner

*Primary Examiner* — William Coleman
(74) *Attorney, Agent, or Firm* — H.C. Park & Associates, PLC

(57) ABSTRACT

A display device includes: a display panel including a display surface; a polarizing layer disposed on the display surface of the display panel, the polarizing layer including a retardation layer and a linear polarizer; an adhesive resin layer disposed on the polarizing layer, the adhesive resin layer including a light transmissive resin and about 0.3 wt % to about 5 wt % of a UV absorber dispersed in the light transmissive resin; and a window disposed on the adhesive resin layer, wherein the UV absorber is selected from the group including triazine-based compounds, triazole-based compounds, anthranilate-based compounds, tinuvin-based compounds, zinc oxides (ZnO), cerium dioxides ($CeO_2$), and combinations thereof.

20 Claims, 7 Drawing Sheets

DISPLAY DEVICE COMPRISING POLARIZING LAYER

CROSS-REFERENCE TO RELATED APPLICATION

This application claims priority from and the benefit of Korean Patent Application No. 10-2014-0130115, filed on Sep. 29, 2014, which is hereby incorporated by reference for all purposes as if fully set forth herein.

BACKGROUND

1. Field

Exemplary embodiments relate to a display device including a polarizing layer and an adhesive resin layer.

2. Discussion of the Background

An organic light emitting diode (hereinafter OLED) display is a self-emission type display device that displays an image using an OLED. The OLED display may not require a separate light source, compared to a liquid crystal display (LCD), and thus may have relatively reduced thickness and weight. Further, the OLED display may have low power consumption, high luminance, and high speed of response.

The OLED display includes an electrode of the OLED and variety of other metal (conductive) lines and these electrodes and lines may reflect externally incident light. Therefore, due to the ambient light reflection in bright environments, the OLED display may be disadvantageous in displaying a black color and showing low contrast ratios.

To avoid these drawbacks, a polarizing member for preventing ambient light reflection may be disposed on the OLED to reduce ambient light reflection. The polarizing member includes a linear polarizer, a retardation layer, and a triacetylcellulose (TAC) film configured to support the linear polarizer and the retardation layer and protect the linear polarizer and the OLED from ultraviolet (UV) rays. The TAC film may include a UV absorber to absorb UV rays. However, because the TAC film has low thermal-resistant and moisture-resistant properties, the TAC film disadvantageously deteriorates in a high temperature or high humidity environment. Further, TAC film is relatively thick and lacks flexibility, and thus may be disadvantageous for manufacturing thin-film and flexible display devices.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device including a polarizing layer with a triacetylcellulose film omitted.

Additional aspects will be set forth in the detailed description which follows, and, in part, will be apparent from the disclosure, or may be learned by practice of the inventive concept.

According to one or more exemplary embodiments, a display device includes: a display panel including a display surface; a polarizing layer disposed on the display surface of the display panel, the polarizing layer including a retardation layer and a linear polarizer; an adhesive resin layer disposed on the polarizing layer, the adhesive resin layer including a light transmissive resin and about 0.3 wt % to about 5 wt % of a UV absorber dispersed in the light transmissive resin; and a window disposed on the adhesive resin layer, wherein the UV absorber is selected from the group including triazine-based compounds, triazole-based compounds, anthranilate-based compounds, tinuvin-based compounds, zinc oxides (ZnO), cerium dioxides ($CeO_2$), and combinations thereof.

According to one or more exemplary embodiments, a method of manufacturing a display device includes: preparing a display panel including a display surface; disposing a polarizing layer on the display surface of the display panel; coating an adhesive composition including a light transmissive resin on the polarizing layer; disposing a window on the adhesive composition; and curing the adhesive composition by irradiating light from a UV light source to the adhesive composition through the window to form an adhesive resin layer, wherein the polarizing layer includes a retardation layer and a linear polarizer, the adhesive composition includes about 0.3 wt % to about 5 wt % of a UV absorber dispersed in the light transmissive resin, and the UV absorber is selected from the group including triazine-based compounds, triazole-based compounds, anthranilate-based compounds, tinuvin-based compounds, zinc oxides (ZnO), cerium dioxides ($CeO_2$), and combinations thereof.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
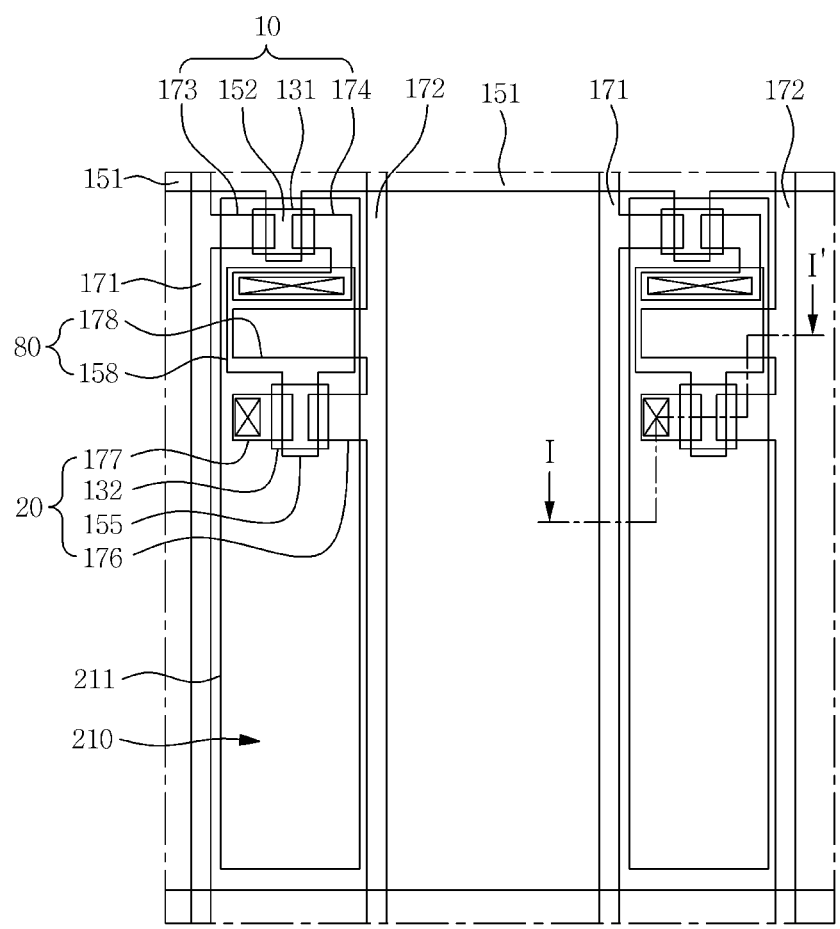
FIG. 1 is a plan view illustrating an organic light emitting diode display according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, an organic light emitting diode display according to one or more exemplary embodiments will be described with reference to FIGS. 1 and 2.

Figure 2:
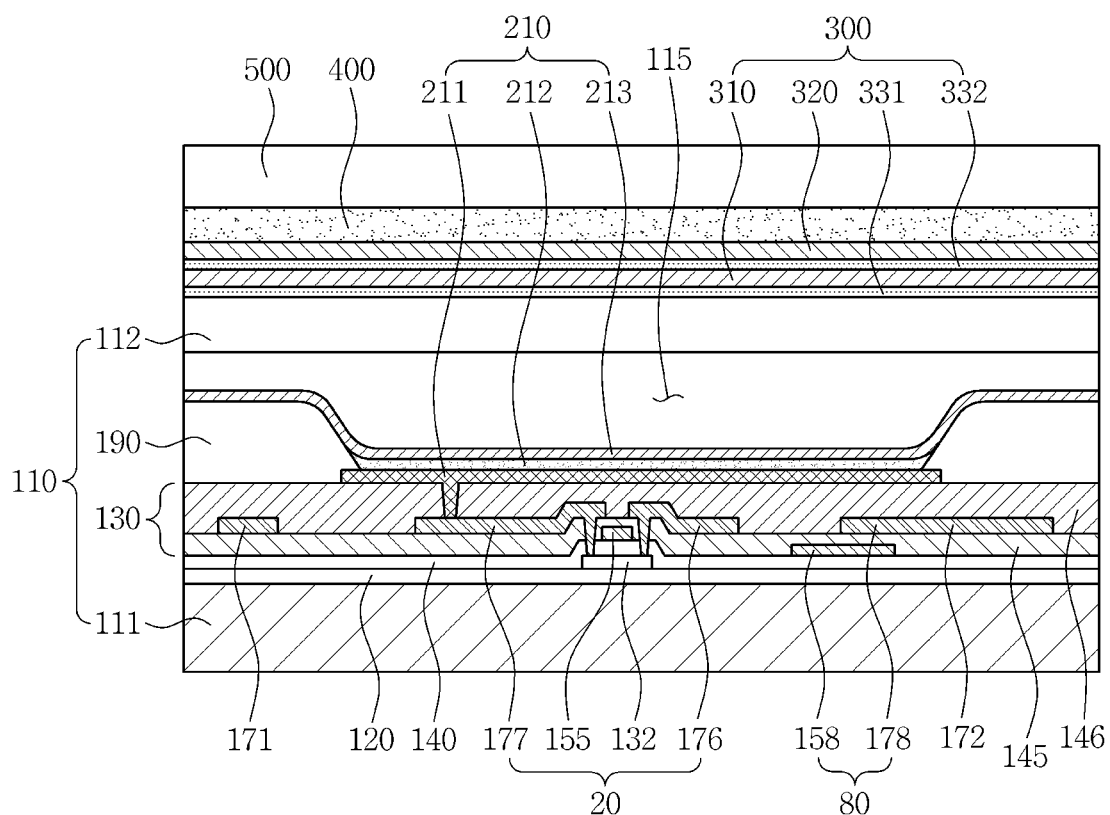
FIG. 2 is a cross-sectional view taken along sectional line I-I' of FIG. 1, according to one or more exemplary embodiments.

FIG. 1 is a plan view illustrating an organic light emitting diode display (hereinafter OLED display) 101 according to one or more exemplary embodiments, and FIG. 2 is a cross-sectional view taken along sectional line I-I' of FIG. 1, according to one or more exemplary embodiments.

Referring to FIGS. 1 and 2, the OLED display 101 may include a display panel 110, a polarizing layer 300, an adhesive resin layer 400, and a window 500. The display panel 110 includes a first substrate 111, a driving circuit 130, an organic light emitting diode (hereinafter OLED) 210, and a second substrate 112.

The first substrate 111 may be made of an insulation material including at least one of glass, quartz, ceramic, plastic and the like, but is not limited thereto. The first substrate 111 may, for example, be made of a metal material such as stainless steel and the like.

A buffer layer 120 is disposed on the first substrate 111. The buffer layer 120 may include at least one layer made of a variety of inorganic and organic layers. The buffer layer 120 is configured to reduce or prevent infiltration of undesirable elements such as impurities and moisture to a driving circuit 130 and the OLED 210, and planarize a surface of the first substrate 111. According to one or more exemplary embodiments, the buffer layer 120 may be omitted.

The driving circuit 130 is disposed on the buffer layer 120. The driving circuit 130 includes a switching thin film transistor (hereinafter TFT) 10 (FIG. 1), a driving TFT 20, and a capacitor 80. The driving circuit 130 is configured to drive the OLED 210. The OLED 210 is configured to emit light according to a driving signal applied from the driving circuit 130 to display an image. The term "pixel" may refer to the smallest unit for displaying an image, and the OLED display 101 displays an image using a plurality of pixels.

Referring to FIGS. 1 and 2, an active-matrix (AM)-type OLED display 101 having a 2Tr-1Cap structure, including two TFTs 10 and 20 and a capacitor 80 in each pixel, but the exemplary embodiments are not limited thereto. According to one or more exemplary embodiments, the OLED display 101 may have other structures including three or more TFTs and two or more capacitors in each pixel, and may further include additional lines.

Each pixel includes the switching TFT 10, the driving TFT 20, the capacitor 80, and the OLED 210. The driving circuit 130 may include a gate line 151 arranged along one direction and a data line 171 and a common power line 172 insulated from and intersecting the gate line 151. Each pixel may be defined by the gate, data, and common power lines 151, 171, and 172, but is not limited thereto. According to one or more exemplary embodiments, the pixel may be defined by a pixel defining layer (not shown) or a black matrix (not shown).

The OLED 210 includes a first electrode 211, an organic light emitting layer 212 disposed on the first electrode 211, and a second electrode 213 disposed on the organic light emitting layer 212. A hole and an electron are respectively injected from the first and second electrodes 211 and 213 into the organic light emitting layer 212. The hole and the electron are combined with each other to form an exciton, and the OLED is configured to emit light by energy generated from the exciton falling from an excited state to a ground state.

The capacitor 80 includes a pair of capacitor plates 158 and 178 and an interlayer insulating layer 145 interposed between the pair of capacitor plates 158 and 178. The interlayer insulating layer 145 may be a dielectric material. Capacitance of the capacitor 80 may be determined by electric charges stored in the capacitor 80 and a voltage applied across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The semiconductor layers 131 and 132 and the gate electrodes 152 and 155 are insulated by a gate insulating layer 140.

The switching TFT 10 is a switching element configured to select a pixel to emit light. The switching gate electrode 152 is connected to the gate line 151 and the switching source electrode 173 is connected to the data line 171. The switching drain electrode 174 is disposed spaced apart from the switching source electrode 173 and connected to the capacitor plate 158.

The driving TFT 20 is configured to apply a driving power, which allows the organic light emitting layer 212 of the OLED 210 in the pixel to emit light, to the first electrode 211 of the OLED 210. The driving gate electrode 155 is connected to the capacitor plate 158 that is connected to the switching drain electrode 174 through a hole formed through the switching drain electrode 174. The driving source electrode 176 and another capacitor plate 178 are respectively connected to the common power line 172. The driving drain electrode 177 is connected to the first electrode 211 of the OLED 210 through a contact hole.

According to the above-described structure, the switching TFT 10 may be operated by applying a gate voltage to the gate line 151 and may be configured to transmit a data voltage applied from the data line 171 to the driving TFT 20. A voltage difference between a common voltage applied from the common power line 172 to the driving TFT 20 and the data voltage transmitted from the switching TFT 10 may be stored in the capacitor 80, and a current corresponding to the voltage stored in the capacitor 80 flows to the OLED 210 through the driving TFT 20, so that the OLED 70 may emit light.

According to one or more exemplary embodiments, the first electrode 211 may be an anode configured to function as a hole injecting electrode and the second electrode 213 may be a cathode configured to function as an electron injecting electrode. The exemplary embodiments are not limited thereto, and the first electrode 211 may be configured to function as a cathode, and the second electrode 213 may be configured to function as an anode.

A planarization layer 146 is disposed on an inter-layer insulating layer 145. The planarization layer 146 may be made of an insulation material and may be configured to protect the driving circuit 130. The planarization layer 146 and the inter-layer insulating layer 145 may be made of the same material.

The drain electrode 177 of the driving TFT 20 is connected to the first electrode 211 of the OLED 210 through a contact hole formed through the planarization layer 146.

According to the exemplary embodiment, the first electrode 211 is a reflective electrode and the second electrode 213 is a transflective electrode. Therefore, light generated from the organic light emitting layer 212 may be emitted through the second electrode 213. That is, the OLED display 101 according to the exemplary embodiment may have a top-emission type structure.

The reflective and transflective electrodes may include at least one of metal including magnesium (Mg), silver (Ag), gold (Au), calcium (Ca), lithium (Li), chromium (Cr), aluminum (Al), and copper (Cu) and metal alloys thereof. The reflective and transflective electrode may be a transflective and/or reflective type according to the respective thickness of each layer. For example, the transflective electrode may have a thickness of about 200 nm or less, for example a transflective electrode may have a thickness of about 20 nm to about 200 nm. The light transmittance may be increased as the thickness of the transflective layer is reduced, and may be decreased as the thickness of the transflective layer is increased. In one or more exemplary embodiments, the term "about" imply a ±10 percentage of the value to be modified.

The first electrode 211 may include a reflective layer including at least one of metal including magnesium (Mg), silver (Ag), gold (Au), calcium (Ca), lithium (Li), chromium (Cr), copper (Cu), and aluminum (Al) and a transparent conductive layer (not shown) disposed on the reflective layer. The transparent conductive layer may include transparent conductive oxides (TCO). The transparent conductive oxides (TCO) may include, for example, at least one of indium tin oxides (ITO), indium zinc oxides (IZO), zinc oxides (ZnO), aluminum zinc oxides (AZO), and indium oxides ($In_2O_3$). The transparent conductive layer may have a relatively high work function, and thus the transparent conductive layer may aid the hole injection through the first electrode 211.

The first electrode 211 may also have a triple-layer structure including the transparent conductive layer, the reflective layer, and the transparent conductive layer sequentially laminated.

The second electrode 213 may be formed of a transflective layer including at least one of metal including magnesium (Mg), silver (Ag), gold (Au), calcium (Ca), lithium (Li), chromium (Cr), copper (Cu), and aluminum (Al).

At least one of a hole injection layer HIL (not shown) and a hole transport layer HTL (not shown) may be further disposed between the first electrode 211 and the organic light emitting layer 212. At least one of an electron transport layer ETL (not shown) and an electron injection layer EIL (not shown) may be further disposed between the organic light emitting layer 212 and the second electrode 213.

A structure including the organic light emitting layer 212, the HIL (not shown), the HTL (not shown), the ETL (not shown), and the EIL (not shown) may be referred to as an organic layer. The organic layer may be made of low-molecular-weight organic materials and/or high-molecular-weight organic materials.

The low-molecular-weight organic materials may be used in the HIL (not shown), the HTL (not shown), the organic light emitting layer, the ETL (not shown), and the EIL (not shown). The low-molecular-weight organic materials may have a single-layer laminated structure or multi-layer laminated structure. For example, the organic material may include at least one of copper phthalocyanine (CuPc), N,N'-Di(naphthalene-1-yl)-N,N'-diphenyl-benzidine (NPB), tris-8-hydroxyquinoline aluminum (Alq3), and the like. The high-molecular-weight organic materials may be included in the HTL (not shown) and the organic light emitting layer 212.

A pixel defining layer 190 may have an opening. A part of the first electrode 211 is exposed through the opening of the pixel defining layer 190. The first electrode 211, the organic light emitting layer 212, and the second electrode 213 are sequentially disposed in the opening of the pixel defining layer 190. The second electrode 213 may be disposed not only on the organic light emitting layer 212 but also on the pixel defining layer 190. The OLED 210 emits light from the organic light emitting layer 212 disposed in the opening of the pixel defining layer 190. Accordingly, the pixel defining layer 190 may define a light emitting area.

A capping layer (not shown) may be further disposed on the second electrode 213. The capping layer is configured to protect the OLED 210.

A second substrate 112 is disposed on the OLED 210 facing the first substrate 111 to protect the OLED 210. The second substrate 112 may be formed of the same material as the first substrate 111. A space 115 between the second electrode 213 and the second substrate may be filled with air or an inert gas such as nitrogen gas N2.

A polarizing layer 300 is disposed on the display panel 110 including the first substrate 111, the driving circuit 130, the OLED 210, and the second substrate 112. The polarizing layer 300 is disposed on the second substrate 112 corresponding to a display surface of the display panel 110.

The polarizing layer 300 includes a retardation layer 310 and a linear polarizer 320. Referring to FIG. 2, the polarizing layer 300 may include a first adhesive layer 331 disposed on the second substrate 112, the retardation layer 310 disposed on the first adhesive layer 331, a second adhesive layer 332 disposed on the retardation layer 310, and the linear polarizer 320 disposed on the second adhesive layer 332.

The retardation layer 310 is configured to retard a phase of light. According to the exemplary embodiment, the retardation layer 310 may include a quarter wave plate. The quarter wave plate (hereinafter QWP) may refer to a λ/4 retardation plate. However, the exemplary embodiments are not limited thereto, and a half wave plate can be used as the retardation layer 310. A half wave plate (hereinafter HWP) may refer to a λ/2 retardation plate. The retardation layer 310 may include both of the QWP and the HWP.

The retardation layer 310 is configured to convert linear polarization into circular polarization. Ambient light incident onto the polarizing layer 300 may be converted into linearly-polarized light by the linear polarizer 320 and converted into circularly-polarized light by the retardation layer 310. The circularly-polarized ambient light is subject to destructive interference with other internally reflected light in the display panel 110. Accordingly, ambient light reflection may be prevented or efficiently reduced by the polarizing layer 300 including the linear polarizer 320 and the retardation layer 310. The polarizing layer 300 may thus be configured to prevent or reduce ambient light reflection.

The retardation layer 310 may include a retarder provided in a film to be used as the retardation layer 310. The retarder film can be manufacture by elongation. The retarder film may be manufactured using photo-curable liquid crystals. For example, liquid crystals may be aligned on a high molecular base film and patterned to manufacture the retarder film. Cholesteric liquid crystals and/or lyotropic liquid crystals may be used to form the retarder film. The manufactured retarder film may be a QWP or a HWP depending on an arrangement of alignment layers and liquid crystal materials.

According to the exemplary embodiments, the structure and components of the retardation layer 310 are not limited to the above description, and thus any form of retardation layers known to those having ordinary skill in the pertinent art may be used as the retardation layer 310 of the exemplary embodiments.

The first adhesive layer 331 is disposed between the retardation layer 310 and the second substrate 112, and configured to attach the polarizing layer 300 onto the second substrate 112. The first adhesive layer 331 may include at least one of acrylic adhesive resins, silicon-based adhesive resins, rubber-based adhesive resins, polyester-based adhesive resins and urethane-based adhesive resins.

The second adhesive layer 332 is disposed between the retardation layer 310 and the linear polarizer 320. The second adhesive layer 332 may be made of the same material as the first adhesive layer.

The linear polarizer 320 is disposed on the second adhesive layer 332. The linear polarizer 320 may include polyvinyl alcohol (PVA)-based resin film including absorption-oriented dichroic dyes. The PVA-based resins may include, for example, a polyvinyl acetate that is a homo-polymer of vinyl acetate or a copolymer of the vinyl acetate and other monomer.

The linear polarizer 320 may be manufactured by a method including: elongating one end portion of the PVA-based resin film; dyeing the PVA-based resin film with dichroic dyes and absorbing the dichroic dyes; processing the PVA-based resin film where the dichroic dyes are adsorbed with a boric acid aqueous solution; and washing. However, a method of manufacturing the linear polarizer 320 according to exemplary embodiments is not limited thereto.

For example, Iodine may be used as the dichroic dye and other dichroic dyes used in the pertinent art may also be used. When iodine is used as the dichroic dye, the PVA-based resin film may be soaked and dyed in an aqueous solution containing iodine and potassium iodide to manufacture the linear polarizer.

A thickness of the linear polarizer 320 may vary depending on the products to which it is applied and may be in a range of, for example, 5 to 40 μm.

The linear polarizer 320 may include any commercially available product.

The window 500 is disposed on the polarizing layer 300. The window 500 may include any transparent material that may transmit light therethrough. Further, the adhesive resin layer 400 is disposed between the window 500 and the polarizing layer 300.

The adhesive resin layer 400 is configured to attach the display panel 110 on which the polarizing layer 300 is disposed and the window 500. The adhesive resin layer 400 is configured to protect an OLED 210 in the display panel 110 from ultraviolet (hereinafter, UV) rays.

The adhesive resin layer 400 may include a light-transmissive resin and a UV absorber dispersed within the light-transmissive resin. The light-transmissive resin may have an adhesive property, and the UV absorber may be configured to absorb light within UV wavelengths range.

For example, the adhesive resin layer 400 may include 95 wt % to 99.7 wt % of a light transmissive resin and 0.3 wt % to 5 wt % of a UV absorber dispersed within the light transmissive resin, based on a total weight of an adhesive resin layer. The UV absorber may include at least one of triazine-based compounds, triazole-based compounds, anthranilate-based compounds, tinuvin-based compounds, zinc oxides (ZnO), and cerium dioxides ($CeO_2$).

If the adhesive resin layer 400 includes too much UV absorber, it may have a disadvantageous effect in manufacturing the adhesive resin layer 400 using a photo-curing method. If the adhesive resin layer 400 includes insufficient UV absorber, the UV rays may not be absorbed sufficiently, and the UV rays may infiltrate into the display panel 110. Accordingly the exemplary embodiments, the adhesive resin layer 400 may include 0.3 wt % to 5 wt % of a UV ray absorber based on a total weight of the adhesive resin layer.

The UV absorber may be configured to absorb light having a wavelength in a range of about 290 nm to about 380 nm. Accordingly, the adhesive resin layer 400 is configured to absorb light having a wavelength in a range of about 290 nm to about 380 nm.

The adhesive resin layer 400 has a thickness of about 50 nm to about 300 nm. If the thickness of the adhesive resin layer 400 is less than 50 nm, the adhesive resin layer 400 may not provide sufficient adhesive power and may not absorb sufficient UV rays. If the thickness of the adhesive resin layer 400 is more than 300 nm, the OLED display device may not be formed sufficiently thin.

Accordingly, the adhesive resin layer 400 may be configured to reduce or prevent deterioration of the OLED 210 caused by UV rays during using the OLED display 101. The adhesive resin layer 400 is also configured to reduce or prevent damage to the OLED 210 caused by UV rays during the manufacturing of the OLED display 101.

Figure 3A:
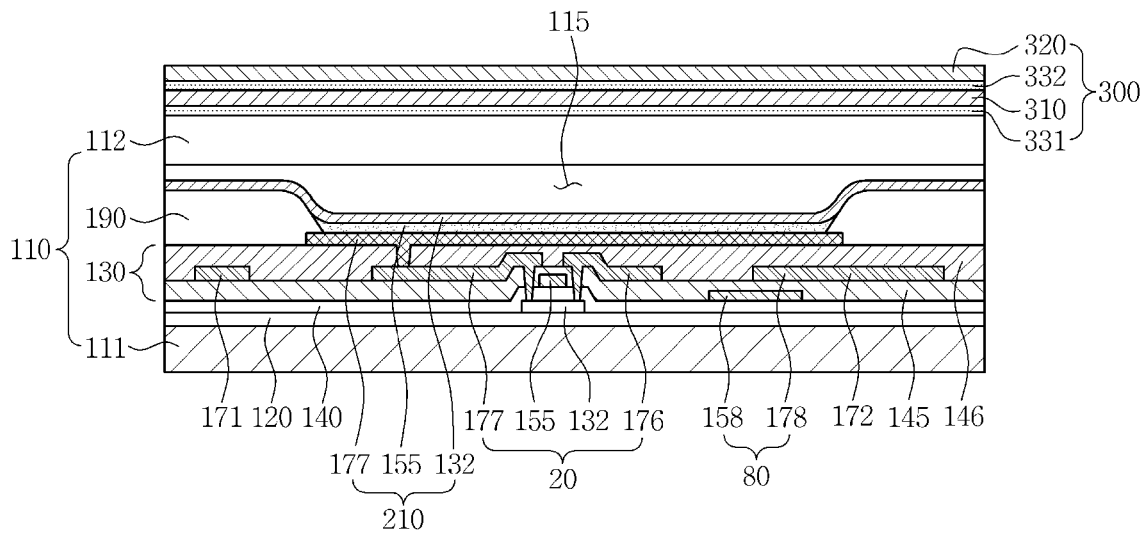
FIGS. 3A, 3B, 3C, and 3D are schematic views illustrating a method of manufacturing an OLED display illustrated in FIG. 1, according to one or more exemplary embodiments.
Figure 3B:
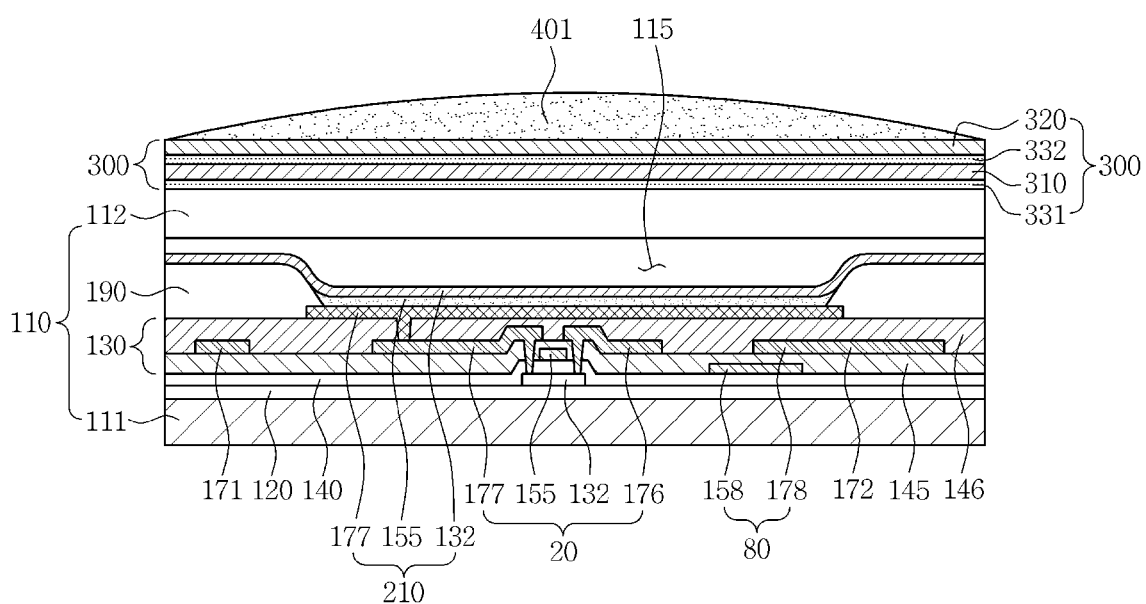
Figure 3C:
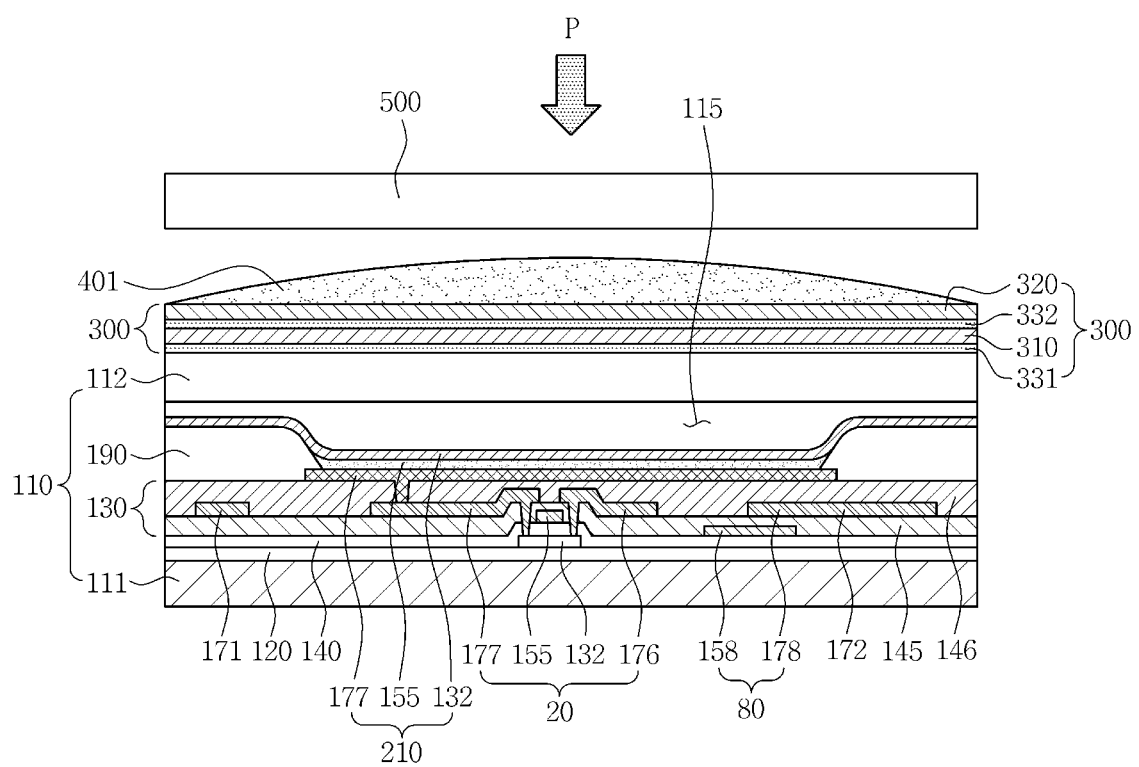

Hereinafter, a method of manufacturing the OLED display 101 according to the exemplary embodiments will be described. FIGS. 3A, 3B, and 3C are schematic views illustrating a method of manufacturing the OLED display according to the one or more than exemplary embodiments.

Referring to FIG. 3A, a display panel 110 including an OLED 210 is manufactured and a polarizing layer 300 is disposed on the display panel 110. A film-shaped polarizing member including a retardation layer 310 and a linear polarizer 320 may be used as the polarizing layer 300. In this case, the polarizing layer 300 is attached to a second substrate 112 of the display panel 110 by a first adhesive layer 331.

Referring to FIG. 3B, an adhesive composition 401 for forming an adhesive resin layer 400 is coated on the polarizing layer 300.

The adhesive composition 401 includes a light-transmissive adhesive resin, a light initiator, and a UV absorber dispersed in the light-transmissive adhesive resin. The light-transmissive adhesive resin may include at least one of acrylic adhesive resins, silicon-based adhesive resins, rubber-based adhesive resins, polyester-based adhesive resins and urethane-based adhesive resins. For example, a urethane acrylate resin may be used as the light-transmissive adhesive resin.

A method of coating the adhesive composition 401 on the polarizing layer 300 is not particularly limited. The coating method may include die coater, air knives, reverse rolls, sprays, blades, casting, gravure, micro gravure or spin coating. For example, the adhesive composition 401 can be coated on the polarizing layer 300 in a fish bone shape.

Referring to FIG. 3C, a window 500 is disposed on the adhesive composition 401. A predetermined pressure P is applied on the window 500 to allow the window 500 to fully contact the adhesive composition 401.

Figure 3D:
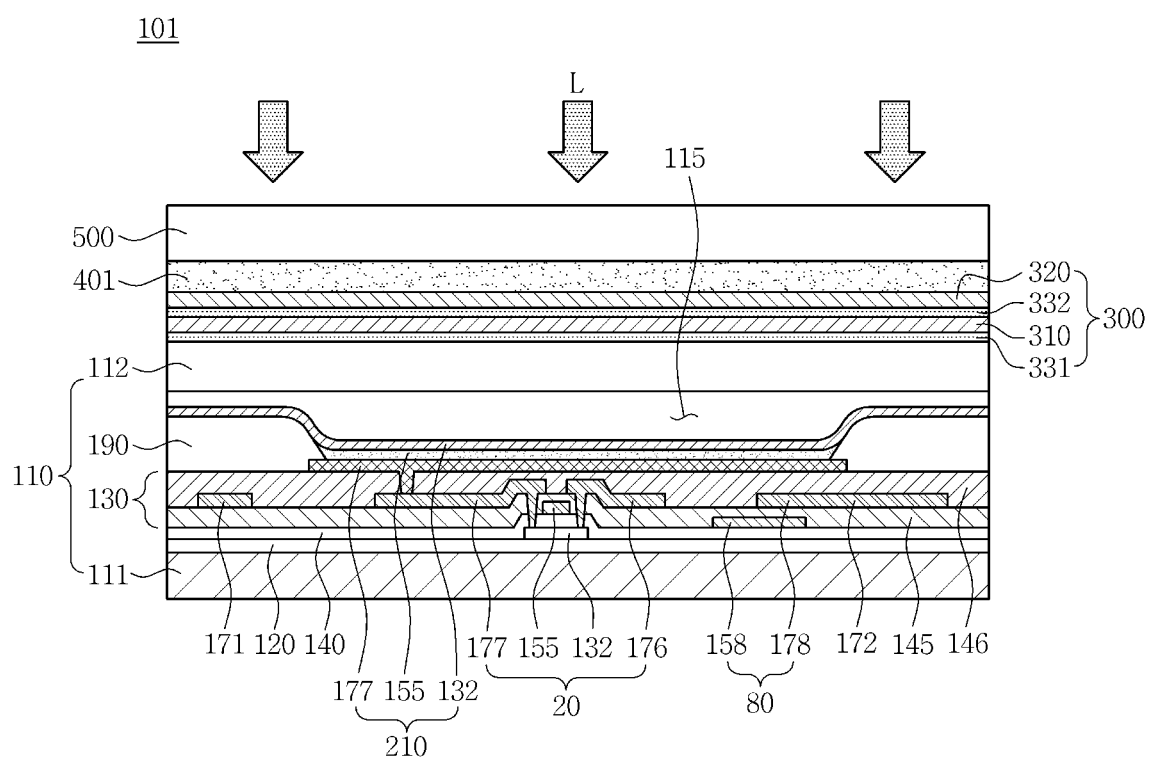

Referring to FIG. 3D, light L is irradiated toward the adhesive composition through the window to cure the adhesive composition 401. The adhesive composition 401 may be cured by the light L irradiation (i.e., photo curing) to form an adhesive resin layer 400, and the window 500 may be attached to the polarizing layer 300 disposed on the display panel 110. The adhesive composition 401 may also be cured to form an adhesive resin layer 400 by thermal curing.

The light L to cure the adhesive composition 401 may include UV rays. When UV rays are used in the curing process reach the OLED 210 of the display panel 110, the OLED 210 may be damaged by the UV rays. The UV absorber included in the adhesive resin layer 400 may be configured to reduce or avoid UV rays used in the curing process reaching the OLED 210 of the display panel 110.

The irradiated UV rays may be mostly used for energy to cure the adhesive composition 401, and rest of the other UV rays may be absorbed by the UV absorber. Accordingly, the radiated UV rays to cure the adhesive composition 401 during the manufacturing may be reduced or prevented from infiltrating into the display panel.

A metal halide lamp may be used as a light source for UV irradiation. The metal halide lamp emits UV rays mostly in a range of about 300 nm to about 400 nm. The UV rays having a short wavelength may have a large energy, and may increase curing speed. The UV rays having a long wavelength may infiltrate deeper into the adhesive composition 401 layer, to provide sufficient curing of the adhesive composition 401.

Light having a wavelength of 370 nm or less, for example, light having a wavelength of 100 nm to 370 nm, which is out of the visible light range, radiated from the metal halide lamp may be entirely absorbed by the adhesive composition 401.

If the adhesive composition 401 includes too much UV absorber, it may have a disadvantageous effect in curing the adhesive composition 401. In contrast, if the adhesive composition 401 includes insufficient UV absorber, the UV rays may not be absorbed sufficiently, and the UV rays may infiltrate into the display panel. Therefore, the adhesive composition 401 may include 0.3 wt % to 5 wt % of the UV absorber based on a total weight of the adhesive composition 401.

The OLED display 101 according to the exemplary embodiments may include the adhesive resin layer 400 configured to absorb UV rays, and thus may omit a separate UV absorption layer.

A conventional polarizing member may include a triacetylcellulose (TAC) film to absorb UV rays from external light. For example, the triacetylcellulose (TAC) film may be disposed both on and under the linear polarizer. However, the triacetylcellulose (TAC) film is comparably thick and lacks flexibility, and may not be suitable for a thin film display and/or a flexible display device. Furthermore, the triacetylcellulose (TAC) film has low thermal-resistant and low moisture-resistant properties, and thereby may not reduce color deterioration of display devices when used in a high temperature and/or humidity environment.

The polarizing layer 300 of the OLED display 101 according to one or more exemplary embodiments, on the other hand, may omit the triacetylcellulose (TAC) film. That is, the polarizing layer 300 of the OLED display 101 according to the exemplary embodiments may be a TAC-free type without a triacetylcellulose (TAC) film. Therefore, the OLED display 101 according to the exemplary embodiments may be formed into a thin-film type having excellent flexibility.

Hereinafter, an organic light emitting diode display according to one or more exemplary embodiments will be described with reference to FIG. 4.

Figure 4:
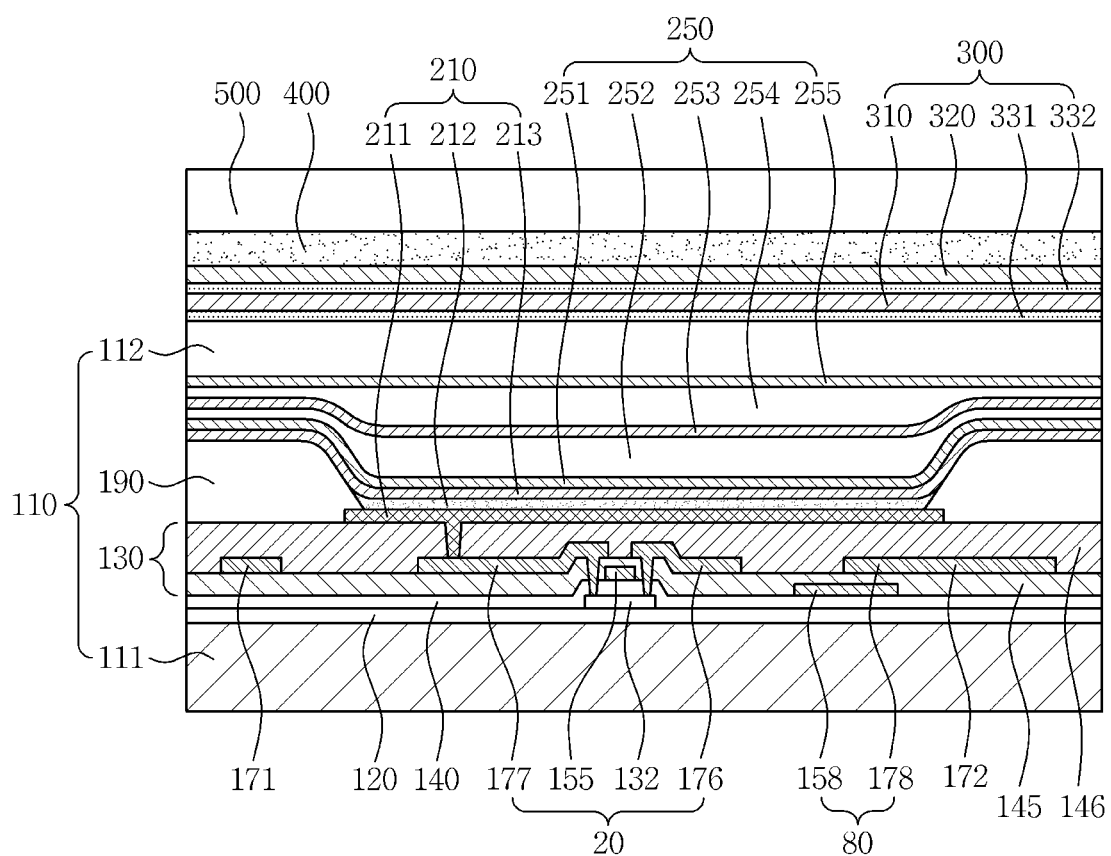
FIG. 4 is a cross-sectional view illustrating an organic light emitting diode display according to one or more exemplary embodiments.

FIG. 4 is a cross-sectional view illustrating an OLED display 102 according to one or more exemplary embodiments. In order to avoid repetition, configurations described for like elements illustrated in FIG. 2 will be omitted.

The OLED display 102 according to the exemplary embodiments may include a thin film encapsulation layer 250 disposed on the OLED 210.

The thin film encapsulation layer 250 includes one or more of inorganic layers 251, 253, and 255 and one or more of organic layers 252 and 254. The thin film encapsulation layer 250 has a structure where the inorganic layers 251, 253, and 255 and the organic layers 252 and 254 are alternately disposed. The inorganic layer 251 is disposed on the OLED 210. FIG. 4 illustrates that the thin film encapsulation layer 250 includes three inorganic layers 251, 253, and 255 and two organic layers 252 and 254, but the exemplary embodiments are not limited thereto.

The inorganic layers 251, 253, and 255 may include at least one of inorganic materials including $Al_2O_3$, $TiO_2$, ZrO, $SiO_2$, AlON, AlN, SiON, $Si_3N4$, ZnO, and $Ta_2O_5$. The inorganic layers 251, 253, and 255 may be formed by a chemical vapor deposition (CVD) method and/or an atomic layer deposition (ALD) method, but formation of the exemplary embodiments are not limited thereto. According to exemplary embodiments, the inorganic layers 251, 253, and 255 may be formed by a variety of methods known to those having ordinary skill in the art.

The organic layers 252 and 254 may be formed of a polymer material. The polymer material may include at least one of acrylic resins, epoxy resins, polyimide, and polyethylene. The organic layers 252 and 254 may be formed by a thermal deposition process. According to the thermal deposition process, the organic layers 252 and 254 may be formed in a predetermined temperature range and reduce damage the OLED 210. However, the exemplary embodiments are not limited thereto, and according to exemplary embodiments, the organic layers 252 and 254 may be formed by a variety of methods known to those having ordinary skill in the art.

The inorganic layers 251, 253, and 255 having a high density of thin films may prevent or efficiently reduce infiltration of moisture and/or oxygen. Most of the moisture and oxygen infiltration into the OLED 210 may be limited or blocked by the inorganic layers 251, 253, and 255.

Any moisture and oxygen passing through the inorganic layers 251, 253, and 255 may be limited or blocked by the organic layers 252 and 254. The organic layers 252 and 254 may have a relatively low moisture-infiltration prevention effect compared to the inorganic layers 251, 253, and 255. However, the organic layers 252 and 254 may function as a buffer layer configured to reduce stress between each layer of the inorganic layers 251, 253, and 255. The organic layers 252 and 254 may also planarize the surface, and the top surface of the thin film encapsulation layer 250 may be planarized.

The thin film encapsulation layer 250 may have a thickness of 10 μm or less, for example, the thin film encapsulation layer 250 may have a thickness of 2 μm to 10 μm. Therefore, the OLED display 102 can be manufactured to be relatively thin.

A second substrate 112 is disposed on the thin film encapsulation layer 250. Further, a polarizing layer 300, an adhesive resin layer 400, and a window 500 are sequentially disposed on the second substrate 112.

According to exemplary embodiments, the second substrate 112 may be omitted. When the second substrate 112 is omitted, the OLED display 102 may have an improved flexibility.

Figure 5A:
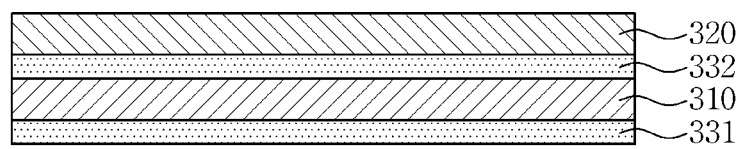
FIGS. 5A, 5B, and 5C are cross-sectional views respectively illustrating a polarizing member according to one or more exemplary embodiments.
Figure 5B:
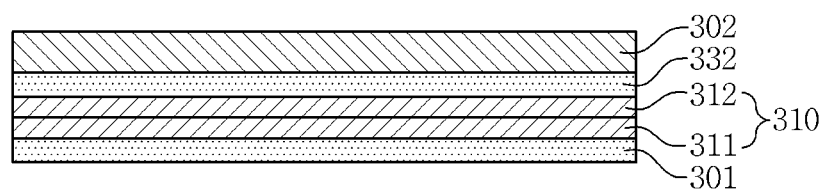
Figure 5C:
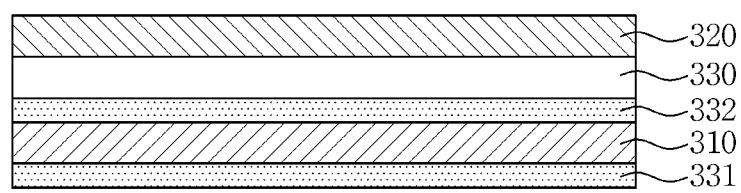

FIGS. 5A, 5B, and 5C are cross-sectional views respectively illustrating a polarizing member according to one or more exemplary embodiments.

The polarizing members illustrated in FIGS. 5A, 5B, and 5C may be included in the polarizing layer 300 of the OLED displays 101 and 102 according to the exemplary embodiments.

Referring to FIG. 5A, the polarizing member may include a first adhesive layer 331, a retardation layer 310 disposed on the first adhesive layer 331, the second adhesive layer 332 disposed on the retardation layer 310, and the linear polarizer 320 disposed on the second adhesive layer 332.

The retardation layer 310 may include the QWP and/or the HWP.

Referring to FIG. 5B, the polarizing member may include both of the QWP 311 and the HWP 312. A position of the QWP 311 and the HWP 312 may vary.

Referring to FIG. 5C, the polarizing member may include a support layer 330 disposed between the second adhesive layer 332 and the linear polarizer 320. The support layer 330 is configured to support the linear polarizer 320 and the retardation layer 310 to maintain a film form of the polarizing member. The support layer 330 may include an optical film such as polyethylene terephthalate (PET) film.

The exemplary embodiments of the polarizing members illustrated in FIGS. 5A, 5B, and 5C may further include a release layer (not shown) disposed on the first adhesive layer 331.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
    a display panel comprising a display surface;
    a polarizing layer disposed on the display surface of the display panel, the polarizing layer comprising a retardation layer and a linear polarizer;
    an adhesive resin layer disposed on the polarizing layer, the adhesive resin layer comprising a light transmissive resin and about 0.3 wt % to about 5 wt % of a UV absorber dispersed in the light transmissive resin; and
    a window disposed on the adhesive resin layer,
    wherein the UV absorber is selected from the group consisting of triazine-based compounds, triazole-based compounds, anthranilate-based compounds, tinuvin-based compounds, zinc oxides (ZnO), cerium dioxides ($CeO_2$), and combinations thereof.

2. The display device of claim 1, wherein the retardation layer comprises a quarter wave plate.

3. The display device of claim 1, further comprising a support layer disposed between the retardation layer and the linear polarizer.

4. The display device of claim 1, wherein the adhesive resin layer is configured to absorb light having a wavelength in a range of about 290 nm to about 380 nm.

5. The display device of claim 1, wherein the adhesive resin layer has a thickness in a range of about 50 nm to about 300 nm.

6. The display device of claim 1, wherein the display panel comprises:
a first substrate;
a first electrode disposed on the first substrate;
an organic light emitting layer disposed on the first electrode; and
a second electrode disposed on the organic light emitting layer.

7. The display device of claim 1, wherein the polarizing layer omits a triacetylcellulose (TAC) film.

8. The display device of claim 1, wherein the polarizing member further comprises an adhesive layer disposed between the retardation layer and the linear layer.

9. The display device of claim 2, wherein the retardation layer further comprises a half wave plate.

10. The display device of claim 6, further comprising a thin film encapsulation layer disposed on the second electrode,
wherein the thin film encapsulation layer includes at least one organic layer and at least one inorganic layer alternately disposed.

11. The display device of claim 6, further comprising:
a switching thin film transistor configured to select a pixel to emit light, the switching thin film transistor comprising a switching gate electrode, a switching source electrode, and a switching drain electrode; and
a driving thin film transistor configured to apply a driving power to the organic light emitting layer, the driving thin film transistor comprising a driving gate electrode, a driving source electrode, and a driving drain electrode.

12. The display device of claim 11, further comprising a capacitor comprising a pair of capacitor plates,
wherein one of the capacitor plate is connected to the driving gate electrode, and
wherein the other capacitor plate is connected to the driving source electrode.

13. A method of manufacturing a display device, the method comprising:
preparing a display panel comprising a display surface;
disposing a polarizing layer on the display surface of the display panel;
coating an adhesive composition comprising a light transmissive resin on the polarizing layer;
disposing a window on the adhesive composition; and
curing the adhesive composition by irradiating light from a UV light source to the adhesive composition through the window to form an adhesive resin layer,
wherein the polarizing layer comprises a retardation layer and a linear polarizer,
the adhesive composition comprises about 0.3 wt % to about 5 wt % of a UV absorber dispersed in the light transmissive resin, and
the UV absorber is selected from the group consisting of triazine-based compounds, triazole-based compounds, anthranilate-based compounds, tinuvin-based compounds, zinc oxides (ZnO), cerium dioxides (CeO$_2$), and combinations thereof.

14. The method of claim 13, wherein the UV absorber absorbs light having a wavelength in a range of about 290 nm to about 380 nm.

15. The method of claim 13, wherein the UV light source is a metal halide lamp.

16. The method of claim 13, wherein the UV light source is configured to emit light having a wavelength in a range of about 300 nm to about 400 nm.

17. The method of claim 13, the polarizing layer omits a triacetylcellulose (TAC) film.

18. The method of claim 13, wherein the disposing a polarizing layer comprises:
disposing a retardation layer configured to convert linear polarization into circular polarization; and
disposing a linear polarizer on the retardation layer.

19. The method of claim 18, wherein the retardation layer comprises a half wave plate.

20. The method of claim 18, wherein the retardation layer comprises a quarter wave plate.

* * * * *